United States Patent [19]

Rydval

[11] 4,276,485

[45] Jun. 30, 1981

[54] MONOLITHIC DIGITAL SEMICONDUCTOR CIRCUIT COMPRISING A PLURALITY OF BIPOLAR TRANSISTORS

[75] Inventor: Peter Rydval, Munich, Fed. Rep. of Germany

[73] Assignee: Siemens Aktiengesellschaft, Berlin & Munich, Fed. Rep. of Germany

[21] Appl. No.: 957,458

[22] Filed: Nov. 3, 1978

[30] Foreign Application Priority Data

Nov. 21, 1977 [DE]  Fed. Rep. of Germany ....... 2751881

[51] Int. Cl.³ .................... H03K 19/013; H03K 19/20
[52] U.S. Cl. .................................. 307/463; 307/291; 307/455
[58] Field of Search .............. 307/215, 218, 291, 238, 307/203, 213

[56] References Cited

U.S. PATENT DOCUMENTS

| 3,914,620 | 10/1975 | Millhollan et al. | 307/215 |
|---|---|---|---|
| 4,021,686 | 5/1977 | Zuk | 307/291 |
| 4,099,070 | 7/1978 | Reinert | 307/291 X |

OTHER PUBLICATIONS

H. H. Muller et al., "Fully-Compensated Emitter-Coupled Logic", 1973, IEEE International Solid-State Circuits Conference, Feb. 16, 1973, pp. 168-169.

Primary Examiner—John Zazworsky
Attorney, Agent, or Firm—Hill, Van Santen, Steadman, Chiara & Simpson

[57] ABSTRACT

A monolithic, integrated ECL circuit, e.g., a decoder circuit for bipolar semiconductor stores, wherein a current supply transistor for the current supply of two digital stages is provided under the control of a semiconductor switching element which possesses two determinate switching states. In the first switching state of the semiconductor switching element one digital stage is connected to the current supply transistor and in the second switching state the other digital stage is connected to the current supply transistor.

2 Claims, 7 Drawing Figures

MONOLITHIC DIGITAL SEMICONDUCTOR CIRCUIT COMPRISING A PLURALITY OF BIPOLAR TRANSISTORS

BACKGROUND OF THE INVENTION

The invention relates to a monolithic digital semiconductor circuit comprising a plurality of bipolar transistors, wherein a bipolar transistor which serves to provide the current supply is connected via its emitter to a first supply potential and via its base to a second supply potential, and its collector is connected to the emitter or to the base of a bipolar transistor which belongs to the actual digital semiconductor circuit, and wherein moreover the collector of the last mentioned bipolar transistor is connected to a third supply potential.

Monolithic semiconductor circuits of this kind are preferably produced in the ECL-, EFL- or CML techniques, which are normally based upon a p- or n-conducting silicon crystal or a monocrystalline semiconductor layer which has been epitaxially produced from monocrystalline silicon of this kind on an insulating or semiconducting or metallic substrate and which has a flat surface. This is covered with a first doping mask whose doping windows, which pass through to the semiconductor surface, are shaped in accordance with the outlines of the collector zones of the bipolar transistors which are to be produced. This is then used to produce a number of discrete, trough-like collector zones which have the opposite conductivity type to that of the semiconductor crystal. By means of a second redoping process and a second, corresponding doping mask, a base zone is produced within the individual collector zones and an emitter zone is produced within each base zone. The introduction of the dopants which effect the redoping is carried out either by diffusion or by ion implantation. The common production of the bipolar transistors can be accompanied by the production of further elements which may be provided in the integrated semiconductor circuit, for example diodes.

Through the publication "1973 IEEE International Solid State Circuits Conference ISSCC", 73/Feb. 16, pages 168, 169, it is known to accommodate additional transistors which serve to provide the current supply of the individual logic-linking stages of the integrated digital semiconductor circuit in the silicon monocrystal which accommodates the digital semiconductor circuit. These additional transistors are bipolar transistors and are produced in common with the bipolar transistors of the actual digital semiconductor circuit. The connection of each of these current supply transistors is normally carried out in that the first supply potential is fed via an input impedance (which can be formed by the material of the emitter zone or the emitter supply line of the relevant current supply transistor) to the emitter of the current supply transistor. Moreover, the collector of the current supply transistor is directly connected to the emitter or the base of the digital circuit stage(s) which it supplies.

Normally, a digital circuit of this kind comprises several stages so that a conventional design requires a corresponding number of current supply transistors. However, one of the most essential aims in the design of bipolar integrated circuits, in particular stores, is to keep the value of the so-called power-delay product as low as possible. In modern stores this means, in particular, an appropriate design of the decoder as the latter decisively influences the access time, thus the delay, and also the current consumption of the store. Experience has shown that the current consumption component of conventional decoder circuits constitutes between 50 and 90 percent of the overall current consumption of the store. Therefore, it is desirable to achieve a reduction in this respect.

A known realization along these lines is described in the German AS No. 24 61 088, which relates to a logic-linking element having a high operating speed and comprising a plurality of emitter-coupled inverters, each of which contains a first and a second transistor whose emitters are connected to one another, the base of the first transistor being connected to a connection point to which a signal representing a logic input signal can be connected. This arrangement involves considerable advantages in respect of reducing the power loss. However, it is also desirable to achieve one's aim with the lowest possible transit time.

SUMMARY OF THE INVENTION

Therefore, it is proposed in accordance with the invention that, in the monolithic digital semiconductor circuit defined above, the current supply transistor be connected via a bistable switch-over cell in each of the two switching states of the switch-over cell to the input of a bipolar transistor which is connected by its collector to the third supply potential, that moreover these two bipolar transistors belong to different logic-linking stages of the actual digital semiconductor circuit, and that finally the change in the switching state of the bistable switch-over cell is governed by the change of the digital state in at least one of the logic-linking stages which are connected to the current supply transistor via the switch-over cell.

Thus, this means that the switching state is controlled by the digital pulses which travel over at least one of the two logic-linking stages, which in principle can be achieved in different ways. It is most advantageous for the switch-over cell to consist of two bipolar transistors which are cross-coupled in respect of their base and their collector, and whose collector output is in each case connected to the emitter or to the base of the particular following bipolar transistor composed of the two digital logic-linking stages which are connected via the switch-over cell to the current supply transistor.

This type of design of the switch-over cell or cells has the advantage that their transistors can be produced in common with the bipolar transistors of the actual digital semiconductor circuit by localized, thus masked redoping of the semiconductor monocrystal, in particular, the silicon monocrystal, which is to accommodate the digital semiconductor circuit. As a result both the current supply transistors, which are likewise to be produced simultaneously, and also the transistors of the total number of switch-over cells which are to be provided, and also the transistors of the actual digital semiconductor circuit acquire the same zone sequence, thus the sequence npn or the sequence pnp. The sequence npn is preferably used.

Another important design consists in that the two digital logic-linking stages which are connected via the switch-over cell to the current supply transistor are controlled by digital pulses in such a manner that the two logic-linking stages are always fed simultaneously in inverted form to one another, and that the characteristics of the switch-over cell are such that on the occasion of each change in the digital state of the digital logic-linking stages to which said cell is connected, it responds by changing its own switching state. This is guaranteed in the above described designs of the switch-over cells.

BRIEF DESCRIPTION OF THE DRAWINGS

The invention will now be described in detail making reference to FIGS. 1 to 7.

DESCRIPTION OF THE PREFERRED EMBODIMENTS

Figure 1:
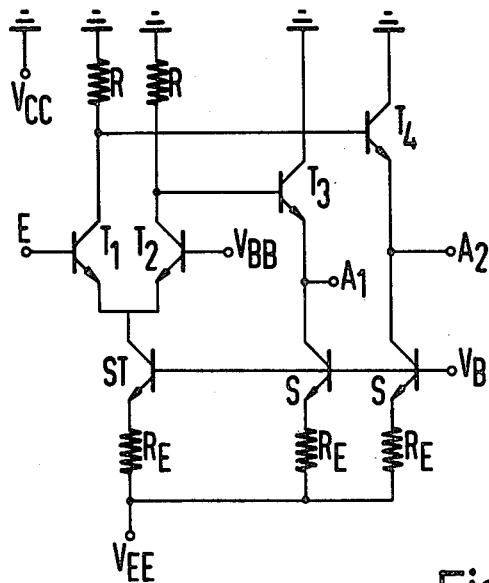
FIG. 1 shows the conventional prior art in an ECL circuit.

The standard ECL gate for decoders and other digital circuits as illustrated in FIG. 1 is constructed as follows: The logic input E is connected to a differential amplifier which consists of two npn transistors T1 and T2 having coupled emitters. The base of transistor T1 forms the pulse input E and the base of transistor T2 is connected to a selected potential $V_{BB}$ which does not conform to the supply potentials $V_{EE}$, $V_B$ or reference potential $V_{CC}$. The current supply of the differential amplifier is supplied by a first current supply transistor ST whose collector is directly connected to the two emitters of the transistors T1 and T2 of the differential amplifier which are connected to one another. The emitter of transistor ST is connected through a resistor $R_E$ to a potential $V_{EE}$. Another source of potential $V_B$ is connected to the base of the current supply transistor. The collectors of transistors T1 and T2 are each connected by resistors R, respectively, to the reference potential $V_{CC}$.

The output of the differential amplifier which is formed by the collector of the transistor $T_2$ is connected to the base zone of a further bipolar transistor $T_3$, and the output formed by the collector of the transistor $T_1$ is connected to the base of a further bipolar transistor $T_4$. Each of the last mentioned bipolar transistors represents not only the input differential amplifier but also a logic-linking stage of the digital ECL circuit, which, in accordance with the conventional art, is in each case assigned a current supply transistor S which can differ in properties, although not necessarily so, from the current supply transistor which feeds the differential amplifier. All of the above mentioned transistors are npn bipolar transistors.

The collectors of the two transistors $T_3$ and $T_4$ are directly connected to the third supply potential $V_{CC}$, whereas their emitters form the two outputs in accordance with the selected circuit as emitter followers. The connection of the current supply transistors S corresponds to that of the current supply transistor ST.

This circuit ensures that a digital pulse connected to the input E of the differential amplifier results in the formation of two digital pulses at the emitters of the two transistors $T_3$ and $T_4$, of which the pulse supplied by $T_4$ is a negative relative to the pulse supplied by $T_3$. Consequently, $A_1$ is the normal output, and $A_2$ the inverted output of the ECL stage corresponding to FIG. 1.

The disadvantage of this conventional circuit as illustrated in FIG. 1 consists in that the current source of the transistors $T_3$ and $T_4$, having a high potential, requires half of the power loss without improving the fan-out.

Thus, no current source is required for switching over into the high state. The switch-over process to low, on the other hand, is decisively dependent upon the current supplied by the relevant current supply transistor S. In order to exploit this fact, in the design of the ECL gate illustrated in FIG. 2, only one current supply transistor S is provided for the two logic-linking stages of the digital circuit which are formed by the transistors $T_3$ and $T_4$, which current supply transistor is connected to the transistors $T_3$ and $T_4$ which are connected as emitter followers via a switch-over cell which is formed by two cross-coupled, npn-transistors $T_5$ and $T_6$.

Figure 2:
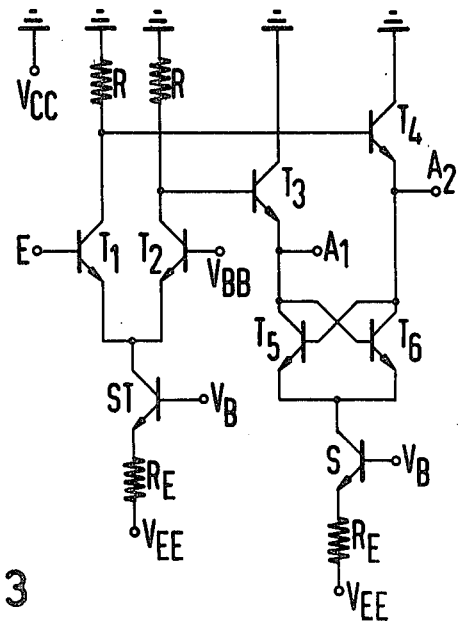
FIGS. 2 to 6 represent various embodiments corresponding to the present invention which are based upon this circuit.
Figure 3:
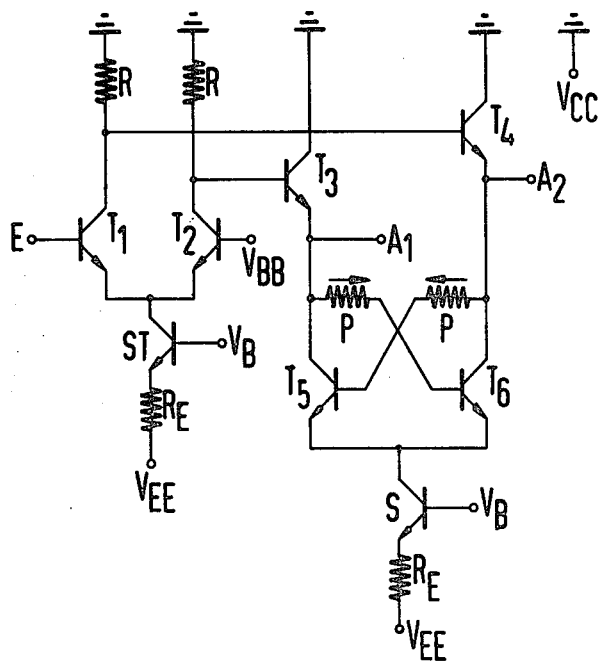

The embodiment illustrated in FIG. 2 can be further improved in accordance with FIG. 3. In fact, a circuit as illustrated in FIG. 2 can only operate well within a small range (which is ensured, for example, in the case of $E^2CL$) or otherwise saturation of the transistors in the switch-over cell can easily occur, as a result of which the dynamic properties of the circuit and possibly also their static function could be impaired.

In order to counteract this, in accordance with a further development of the invention, it is provided that a level-shifting element P is arranged in the same manner between the base of the one and the collector of the other of the two cross-coupled bipolar transistors of the switch-over cell. This level-shifting element P, for example, a diode having a pn-junction or Schottky junction, in particular also a Zener diode, serves to increase the range and should be connected appropriately, i.e., in the sense of blocking the current which flows from the base of the one transistor to the collector of the other transistor of the switch-over cell.

In order to improve the circuit illustrated in FIG. 2, in the manner illustrated in FIG. 3 by means of diodes which serve to increase the level, these (see FIG. 7) should be connected in such a way that the current leading from the base electrodes towards the connected, current-conducting zone of the other transistor is blocked.

Depending upon the nature of the digital logic-linking stages which are to be supplied via the current supply transistor, both the static and the dynamic behavior of these stages can be optimized by an appropriate design of the switch-over cell. The first requirement is that expediently only digital stages which correspond to one another in circuitry should be connected to a common current supply transistor as this produces the best loading balance of the current supply transistor. For this reason, only the two transistors $T_3$ and $T_4$ of the emitter follower stages, and not the transistors of the differential amplifier, are combined via a common switch-over cell.

Figure 4:
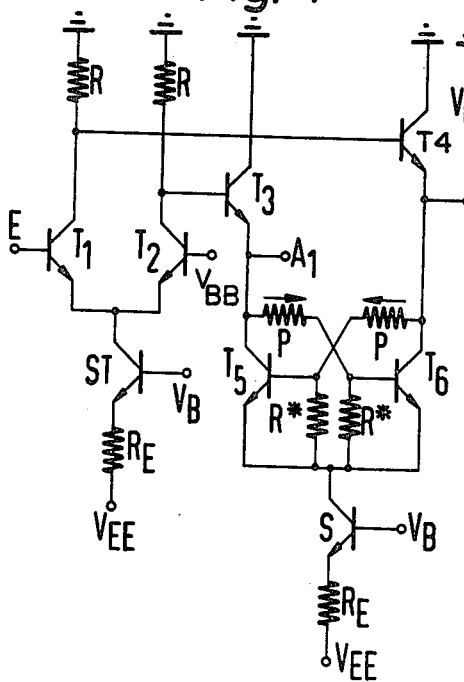
Figure 5:
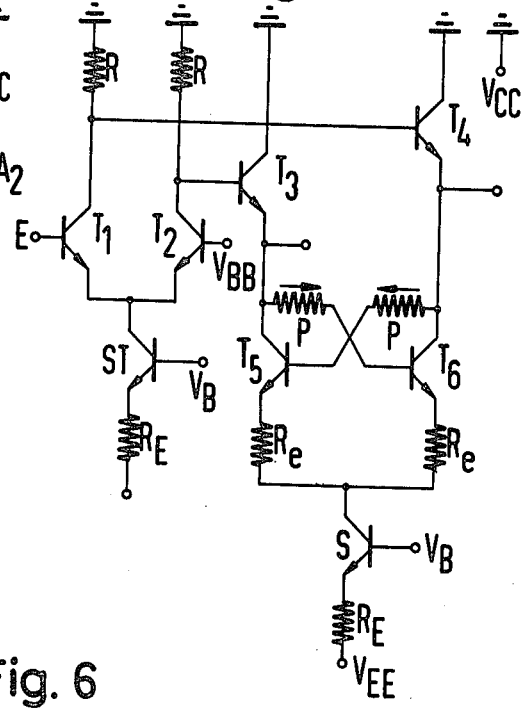

In the design illustrated in FIG. 4, the emitter base diode portion of the two transistors $T_5$ and $T_6$ of the switch-over cell are each shunted by a resistor $R^*$ of equal value. This accelerates the disconnect process of the particular conductive member of the two transistors $T_5$ or $T_6$. An emitter series resistor Re, which (see FIG. 5) is provided for each of the two cross-coupled transistors $T_5$ and $T_6$, also allows an improvement to be effected. If it is intended that these two transistors $T_5$ and $T_6$ should experience different current loading, the two emitter resistors Re are designed differently in appropriate manner.

Figure 6:
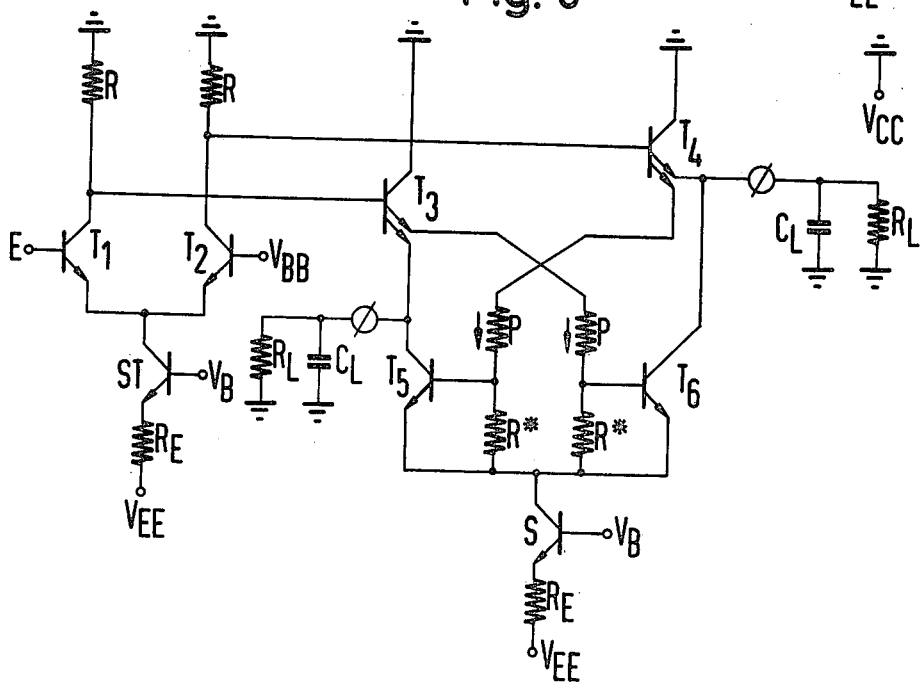

In many cases, it is advisable not to adopt the connection, illustrated in FIGS. 2 to 5, of the transistors $T_5$ and $T_6$ of the switch-over cell and instead to use the mode of connection illustrated in FIG. 6. In this case, the two transistors T₃ and T₄, to be supplied by the current supply transistors S, of the two digital stages which are to be supplied are each equipped with two emitters, one of which is directly connected to the collector of the associated, current-switching transistor T₅ or T₆ of the switch-over cell, whereas the second emitter is connected to the base of the particular other of the two transistors T₅ and T₆. The improvements which can be seen from FIGS. 3 to 5 (in the case illustrated in the drawing the measures illustrated in FIG. 4) can be also applied.

The mode of connection illustrated in FIG. 6 is particularly advisable when the digital stages formed by the two transistors T₃ and T₄ are provided for the feeding of capacitive follower circuits. The double emitter transistor T₃, T₄ facilitates the decoupling of the load circuit formed by the follower stages (in the Figure symbolized by the parallel connection of a capacitance $C_L$ and a resistor $R_L$) from the operation of the current-switching transistors T₅ and T₆ of the switch-over cell. This allows a rapid switch-over, which is independent of the load circuit $R_L$, $C_L$, of the current supplied by the current supply transistor S to the transistors T₃ and T₄.

Figure 7:
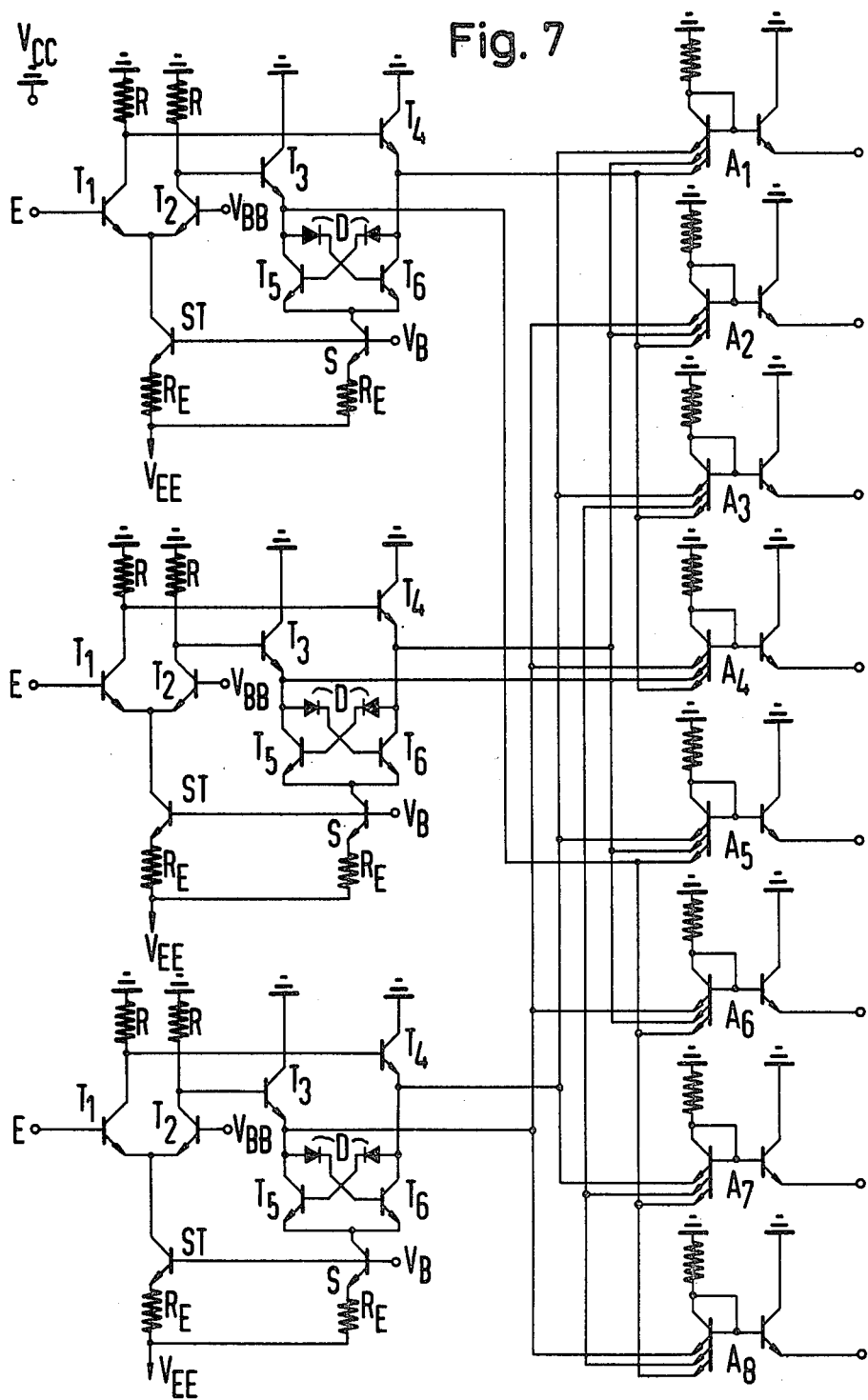
FIG. 7 is the circuit diagram of an appropriately designed 1-from-8 decoder.

FIG. 7 is the circuit diagram of a "1-from-8 decoder" produced in the ECL technique. In order that it may be fed with digital pulses, the latter possesses three inputs E which each operate on a logic cell of the type shown in FIG. 4, thus an OR-NOR-cell. Here, the level-shift elements P consist of diodes D in which the current flow from the base of the transistors T₅ and T₆ to the collector of the particular other of the two transistors is blocked by appropriately setting the polarity of the diodes D.

The individual outputs of the transistors T₃ and T₄ of the individual ECL gates are connected to the output cells A₁–A₈ of the decoder. Each output cell consists of a three-emitter-npn-transistor having a short-circuited base-collector path with an inverter formed by a further transistor of the npn-type. This circuit causes each output cell A₁–A₈ to represent a NOR-gate. The connection of the two outputs of the transistors T₃ and T₄ of the OR-NOR input cells to the output cells A₁–A₈ is contrived to be such that each output of the OR-NOR input cells is connected to four emitter inputs of the total of eight output cells, and it is ensured that each of the output cells A₁–A₈ is connected to all three input-OR-NOR-gates, that moreover only one of the two outputs of each input gate serves to feed an output cell A₁–A₈, and that the normal output of each input gate is connected to four output cells, and the inverted output is connected to the remaining four output cells.

The advantage of a decoder of this kind, designed in accordance with the invention consists on the one hand in the reduction in power loss and on the other hand in the shorter switching time which, in spite of the additional transistors T₅ and T₆ in comparison to a conventional design (i.e., only with one current supply transistor S per digital stage, thus transistor T₃ and T₄), is satisfactorily achieved. It is also clear that the reduction in power loss which is achieved lies in the interests of a compact circuit construction.

It will be apparent to those skilled in the art that many modifications and variations may be effected without departing from the spirit and scope of the novel concepts of the present invention.

I claim as my invention:

1. In a monolithic integrated semiconductor circuit with a differential amplifier, said differential amplifier being formed by first and second bipolar transistors having their respective emitters connected together, a current supply bipolar transistor having its emitter connectable through a resistor to a first potential and having its collector connected to said emitters of said two bipolar transistors of said differential amplifier, the base of said current supply transistor being connectable to a second potential source, the collectors of said differential amplifier transistors being connectable through resistors to a reference potential, the base of a first one of said differential amplifier transistors being connected to an input terminal of said amplifier, a logic linking stage including third and fourth transistors whose collectors respectively are each connectable to said reference potential and whose bases are respectively connected to said collectors of said first and second transistors, a bistable flip-flop including fifth and sixth bipolar transistors each with an emitter connected to a collector terminal of a current supply means, a collector of said fifth transistor is connected to an emitter of said third transistor and a collector of said sixth transistor is connected to an emitter of said fourth transistor, an improvement comprising first and second resistors connected together at a first node and third and fourth resistors connected together at a second node, an opposite end of said first resistor is connected to said emitter of said third transistor, said first node is connected to a base of said sixth transistor and an opposite end of said second resistor is connected to said emitters of said fifth and sixth transistors, an opposite end of said third transistor is connected to said emitter of said fourth transistor, said second node is connected to a base of said fifth transistor and an opposite end of said fourth resistor is connected to said emitters of said fifth and sixth transistors.

2. In a monolithic integrated semiconductor circuit with a differential amplifier, said differential amplifier being formed by first and second bipolar transistors having their respective emitters connected together, a current supply bipolar transistor having its emitter connectable through a resistor to a first potential and having its collector connected to said emitters of said two bipolar transistors of said differential amplifier, the base of said current supply transistor being connectable to a second potential source, the collectors of said differential amplifier transistors being connectable through resistors to a reference potential, the base of a first one of said differential amplifier transistors being connected to an input terminal of said amplifier, a logic linking stage including third and fourth transistors whose collectors respectively are each connectable to said reference potential and whose bases are respectively connected to said collectors of said first and second transistors, a bistable flip-flop including fifth and sixth bipolar transistors each with an emitter connected to a collector terminal of a current supply means, a collector of said fifth transistor is connected to an emitter of said third transistor and a collector of said sixth transistor is connected to an emitter of said fourth transistor, an improvement comprising first and second resistors connected together at a first node and third and fourth resistors connected together at a second node, an opposite end of said first resistor is connected to a second emitter of said third transistor, said first node is connected to a base of said sixth transistor and an opposite end of said second resistor is connected to said emitters of said fifth and sixth transistors, an opposite end of said third resistor is connected to a second emitter of said fourth transistor, said second node is connected to a base of said fifth transistor and an opposite end of said fourth resistor is connected to said emitters of said fifth and sixth transistors.

* * * * *